(12) United States Patent
Illek et al.

(10) Patent No.: US 8,965,148 B2
(45) Date of Patent: Feb. 24, 2015

(54) OPTOELECTRONIC COMPONENT AND METHOD FOR PRODUCING AN OPTOELECTRONIC COMPONENT

(75) Inventors: Stefan Illek, Donaustauf (DE); Alexander Linkov, Regensburg (DE); Matthias Sabathil, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 99 days.

(21) Appl. No.: 13/643,934

(22) PCT Filed: Mar. 28, 2011

(86) PCT No.: PCT/EP2011/054680
§ 371 (c)(1),
(2), (4) Date: Oct. 26, 2012

(87) PCT Pub. No.: WO2011/134727
PCT Pub. Date: Nov. 3, 2011

(65) Prior Publication Data
US 2013/0039617 A1    Feb. 14, 2013

(30) Foreign Application Priority Data

Apr. 27, 2010   (DE) .......................... 10 2010 028 246

(51) Int. Cl.
| | | |
|---|---|---|
| G02B 6/12 | (2006.01) | |
| F21V 8/00 | (2006.01) | |
| H01L 33/50 | (2010.01) | |
| H01L 33/56 | (2010.01) | |
| H01L 33/00 | (2010.01) | |
| H01L 33/60 | (2010.01) | |

(52) U.S. Cl.
CPC ............ *G02B 6/0023* (2013.01); *G02B 6/0073* (2013.01); *H01L 33/501* (2013.01); *H01L 33/56* (2013.01); *H01L 33/60* (2013.01); *H01L 2933/0091* (2013.01)
USPC .............................................. 385/14; 257/98

(58) Field of Classification Search
None
See application file for complete search history.

(56) References Cited

U.S. PATENT DOCUMENTS

| 5,813,753 | A | 9/1998 | Vriens et al. | |
|---|---|---|---|---|
| 6,686,676 | B2 * | 2/2004 | McNulty et al. | 313/112 |
| 6,791,259 | B1 * | 9/2004 | Stokes et al. | 313/503 |
| 7,040,774 | B2 * | 5/2006 | Beeson et al. | 362/84 |
| 7,750,359 | B2 * | 7/2010 | Narendran et al. | 257/98 |
| 7,819,549 | B2 * | 10/2010 | Narendran et al. | 362/228 |
| 8,031,393 | B2 * | 10/2011 | Narendran et al. | 359/326 |
| 8,344,407 | B2 * | 1/2013 | Inoue et al. | 257/98 |
| 8,368,099 | B2 * | 2/2013 | Lu et al. | 257/98 |

(Continued)

FOREIGN PATENT DOCUMENTS

| DE | 10 2005 003460 | 10/2005 |
|---|---|---|
| DE | 10 2004 052456 | 4/2006 |
| DE | 10 2005 019376 | 11/2006 |
| DE | 10 2007 007 847 | 9/2007 |
| DE | 203 21 614 | 6/2008 |
| DE | 10 2008 022 888 | 11/2009 |
| JP | 2003-298115 | 10/2003 |
| JP | 2004-055632 | 2/2004 |
| JP | 2006-004877 | 1/2006 |
| JP | 2006-134661 | 5/2006 |
| JP | 2007-165508 | 6/2007 |
| JP | 2007-221048 | 8/2007 |
| JP | 2008-053660 | 3/2008 |
| JP | 2009-173871 | 8/2009 |
| JP | 2009-249445 | 10/2009 |
| JP | 2009-252898 | 10/2009 |
| JP | 2010-003941 | 1/2010 |
| WO | WO 2009/135620 | 11/2009 |

*Primary Examiner* — Rhonda Peace
(74) *Attorney, Agent, or Firm* — Cozen O'Connor

(57) ABSTRACT

An optoelectronic component (1) comprises a carrier (2) and at least one semiconductor chip (3). The semiconductor chip (3) is arranged on the carrier (2) and designed for emitting a primary radiation (6). The semiconductor chip (3) is at least partly enclosed by an at least partly transparent medium (7) having a height (8) above the carrier (2) and a width (9) along the carrier (2). Particles (10, 11) are introduced into the medium (7) and interact with the primary radiation (6). The medium (7) has a ratio of the height (8) to the width (9) of greater than 1.

18 Claims, 23 Drawing Sheets

(56) References Cited

U.S. PATENT DOCUMENTS

| | | |
|---|---|---|
| 8,455,905 B2 * | 6/2013 | Fujikane et al. ............... 257/98 |
| 8,502,251 B2 * | 8/2013 | Oberleitner et al. ........... 257/98 |
| 2002/0195587 A1 * | 12/2002 | Srivastava et al. ..... 252/301.4 R |
| 2003/0168669 A1 * | 9/2003 | Chua ............................... 257/98 |
| 2003/0189217 A1 | 10/2003 | Imai |
| 2004/0233664 A1 * | 11/2004 | Beeson et al. ................ 362/231 |
| 2006/0203468 A1 * | 9/2006 | Beeson et al. .................. 362/84 |
| 2007/0194676 A1 | 8/2007 | Tanda et al. |
| 2007/0246734 A1 | 10/2007 | Lee et al. |
| 2008/0191620 A1 * | 8/2008 | Moriyama et al. ............ 313/506 |
| 2008/0246044 A1 * | 10/2008 | Pang ............................... 257/98 |
| 2008/0315228 A1 | 12/2008 | Krames et al. |
| 2009/0065792 A1 * | 3/2009 | Thompson et al. ............. 257/98 |
| 2009/0163654 A1 | 6/2009 | Hirano |
| 2009/0166652 A1 * | 7/2009 | Sakai et al. ..................... 257/98 |
| 2009/0272985 A1 * | 11/2009 | Ishii et al. ....................... 257/88 |
| 2011/0057226 A1 * | 3/2011 | Oberleither et al. ............ 257/98 |
| 2011/0073899 A1 * | 3/2011 | Inoue et al. ..................... 257/98 |
| 2011/0303935 A1 * | 12/2011 | Chern ............................. 257/98 |
| 2013/0039617 A1 * | 2/2013 | Illek et al. ....................... 385/14 |

* cited by examiner

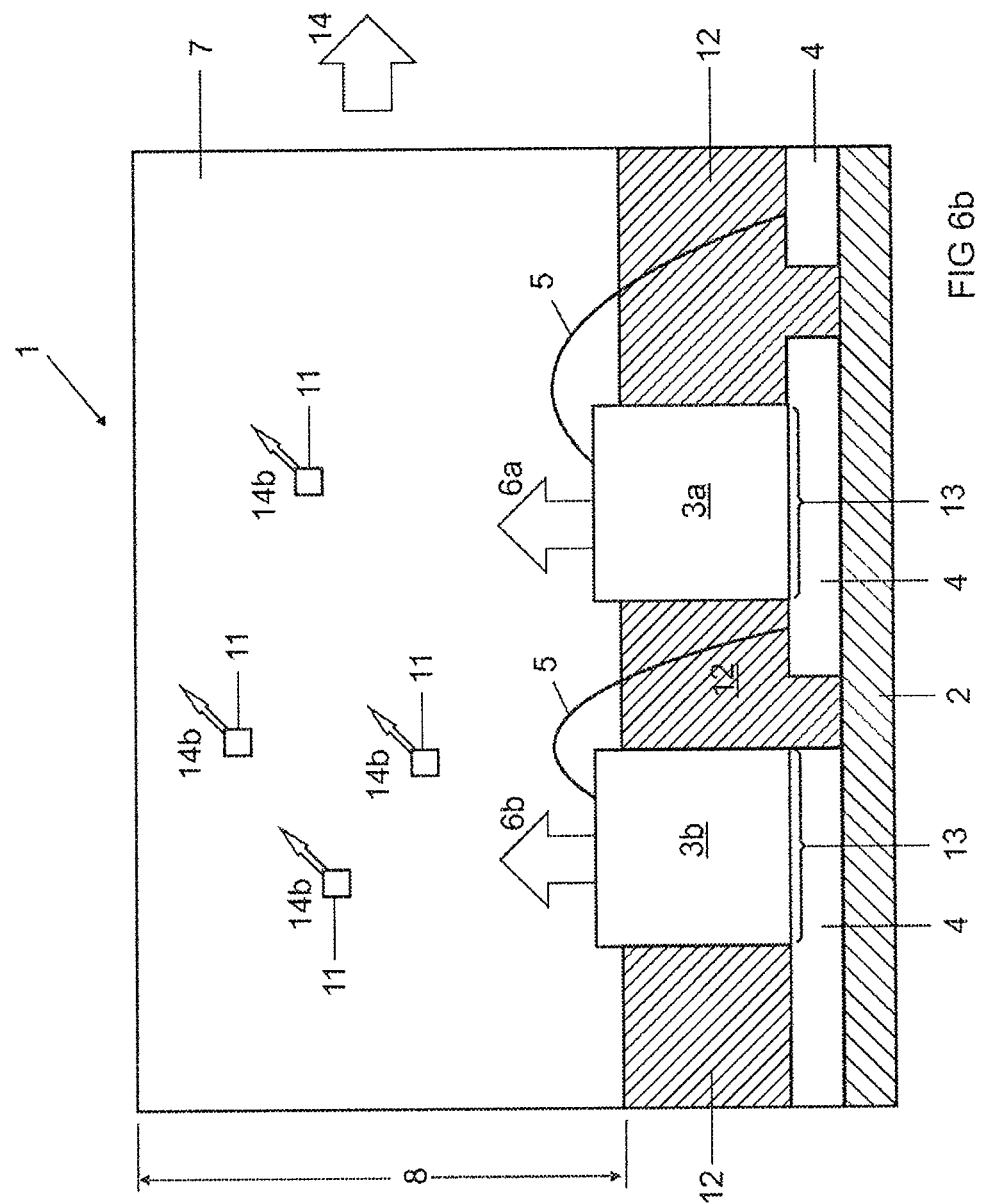

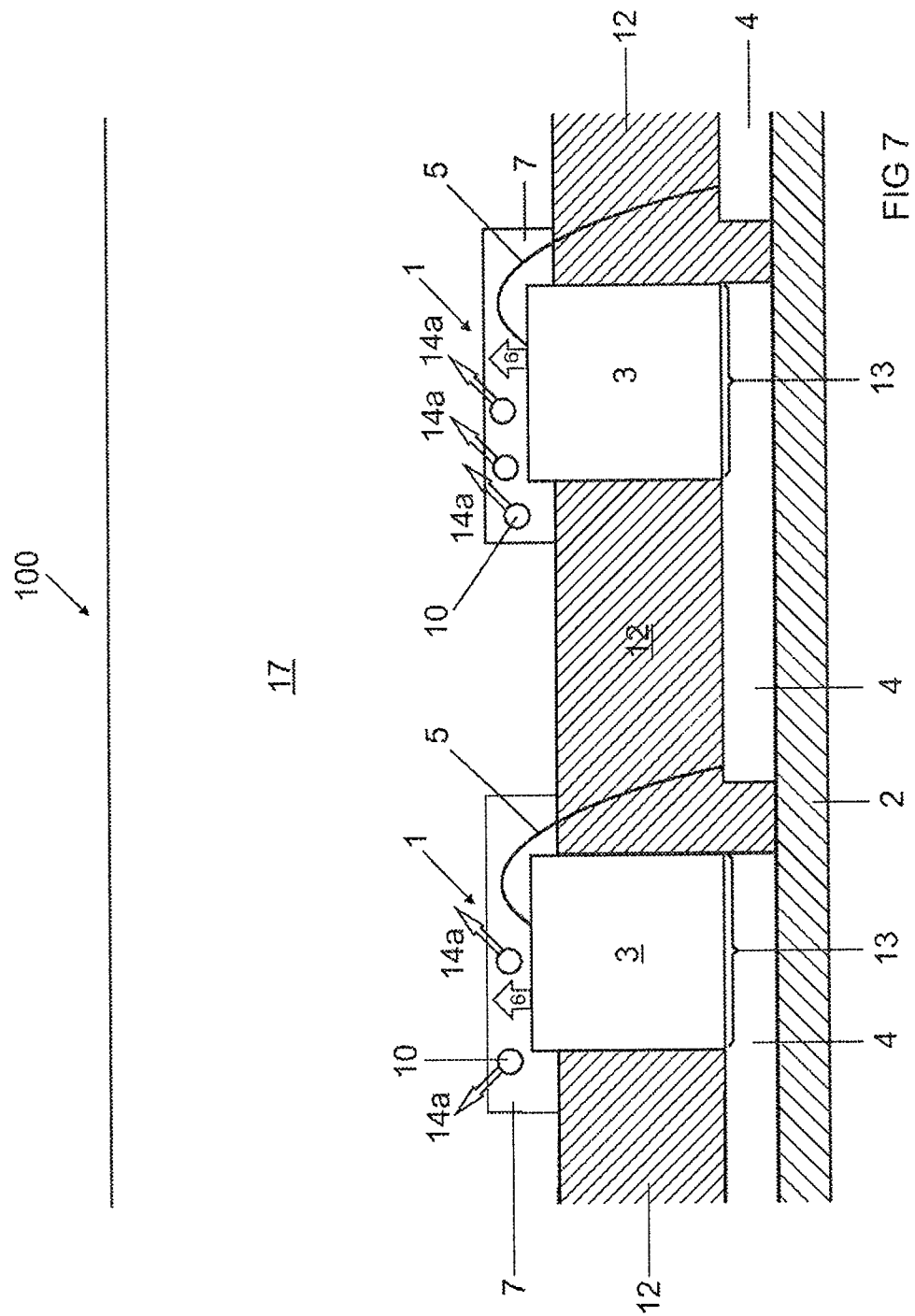

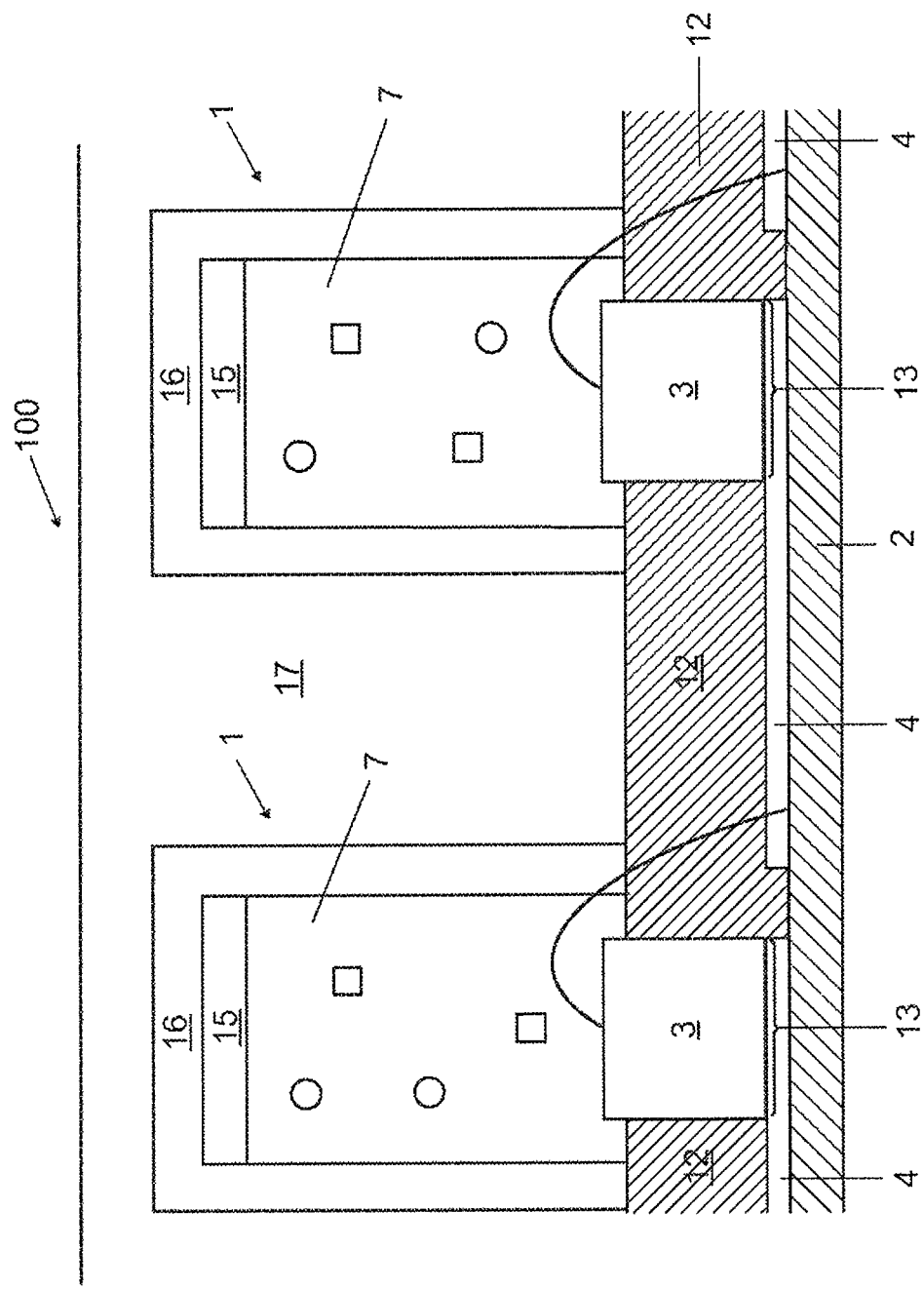

OPTOELECTRONIC COMPONENT AND METHOD FOR PRODUCING AN OPTOELECTRONIC COMPONENT

RELATED APPLICATIONS

This is a U.S. National Phase Application under 35 USC 371 of International Application PCT/EP2011/054680 filed on Mar. 28, 2011.

This application claims the priority of German application no. 10 2010 028 246.4 filed Apr. 27, 2010, the entire content of which is hereby incorporated by reference.

FIELD OF THE INVENTION

The present invention relates to an optoelectronic component comprising a semiconductor chip for emitting electromagnetic radiation, and to a lighting device comprising at least one such optoelectronic component. Furthermore, a method for producing an optoelectronic component is specified.

BACKGROUND OF THE INVENTION

Optoelectronic components and lighting devices comprising them are known from the prior art. Thus, the document WO 2009/135620A1 discloses a lighting device comprising luminous means which emit electromagnetic radiation. One configuration of a luminous means can be an optoelectronic component. Through interaction with particles, the electromagnetic radiation is partly deflected and partly altered with regard to its wavelength. The deflection of the electromagnetic radiation can be achieved by a gradient of the particle density. However, the setting of a gradient of the particle density in production is very complex, difficult to reproduce and expensive.

The optoelectronic components have an optically active epitaxial layer applied on a carrier, as disclosed for example in the document DE102005003460A1.

SUMMARY OF THE INVENTION

It is an object of the invention to specify an optoelectronic component and a lighting device comprising at least one such optoelectronic component which comprises particles in a medium, such that the electromagnetic radiation is deflected in a preferred direction, namely horizontally with respect to the carrier. Moreover, a uniform light distribution in the lighting device is intended to be possible without complex coupling-out structures.

One aspect of the present invention is directed to an optoelectronic component comprising, a carrier; at least one semiconductor chip, arranged on the carrier, for emitting a primary radiation; and at least partly transparent medium at least partly enclosing the semiconductor chip and having a height above the carrier and a width along the carrier; and particles introduced in the medium and serving for interaction with the primary radiation, wherein the medium has a ratio of the height to the width of greater than 1.

Another aspect of the invention is directed to a method for producing an optoelectronic component comprising the following method steps: providing a semiconductor chip on a carrier; introducing particles into a medium composed of a transparent matrix material, in particular a transparent silicon, pouring the medium into a mold, thermally curing the medium, applying the medium to the semiconductor chip, such that a ratio of a height of the medium above the carrier to a width of the medium along the carrier is greater than 1.

Another aspect of the present invention is directed to an optoelectronic component comprising a carrier, at least one semiconductor chip, arranged on the carrier, for emitting a primary radiation, an at least partly transparent medium at least partly enclosing the semiconductor chip and having a height above the carrier and a width along the carrier, and particles introduced in the medium and serving for interaction with the primary radiation, wherein the medium has a ratio of the height to the width of greater than 1 and a partly reflective layer, which is provided at least in regions on a side of the medium which faces away from the semiconductor chip.

Various embodiments comprise an optoelectronic component comprising a carrier and comprising at least one semiconductor chip. The semiconductor chip is arranged on the carrier and emits a primary radiation. Furthermore, the component comprises an at least partly transparent medium at least partly enclosing the semiconductor chip. The medium has a height above the carrier and a width along the carrier. Particles serving for interaction with the primary radiation are introduced into the medium. The medium has a ratio of the height to the width (aspect ratio) of greater than 1. This ensures that electromagnetic radiation is deflected in a preferred direction, namely horizontally with respect to the carrier.

The semiconductor chip usually has an active zone which emits the primary radiation. The active zone can be a pn junction, a double heterostructure, multiple quantum well structure (MQW) or single quantum well structure (SQW). Quantum well structure means: quantum wells (3-dim), quantum wires (2-dim) and quantum dots (1-dim).

The medium can comprise, for example, a silicone, epoxy, glass or ceramic. The medium should be as lightfast as possible and at least partly transparent to the primary radiation.

The optoelectronic component is intended to deflect electromagnetic radiation in a preferred direction, namely horizontally with respect to the carrier. Moreover, a uniform light distribution in the lighting device is intended to be possible without complex coupling-out structures. This is achieved by virtue of the fact that the medium comprising the particles has an aspect ratio of greater than 1. This horizontal deflection of the electromagnetic radiation is particularly advantageous, for example, for coupling the electromagnetic radiation into an optical waveguide.

An element of one embodiment of the invention is to arrange a scattering medium which laterally deflects the frontally emitted light of an LED chip in a simple and efficient manner. Application in a planar optical waveguide can thus be simplified or be made possible for the first time. For an optimum efficiency and side emission, the concentration of the particles and the aspect ratio have to be coordinated with one another.

In one preferred embodiment of the optoelectronic component, the particles are distributed homogeneously in the medium. This is advantageous since a homogeneous distribution can be produced in a particularly simple manner and enables a uniform emission of electromagnetic radiation.

In one preferred embodiment of the optoelectronic component, the particles comprise phosphor particles designed for an absorption of the primary radiation and an emission of a first portion of a secondary radiation. The phosphor particles can consist of a phosphorescent material. In one preferred exemplary embodiment, the phosphorescent material that can be used is a yttrium aluminum garnet ($Y_3Al_5O_{12}$ in a concentration of 5 to 15 percent by weight, which converts blue primary light into yellow light. At a concentration of 5 percent by weight of the yttrium aluminum garnet in the medium, this results in a bluish white secondary radiation. At the higher concentration of 15 percent by weight, this results in a yellowish white secondary radiation. The phosphor particles can also be composed of a phosphorescent material composed of lanthanum-doped yttrium oxide ($Y_2O_3$-$La_2O_3$), dysprosium oxide ($Dy_2O_3$), aluminum oxynitride ($Al_{23}O_{27}N_5$) or aluminum nitride (AlN), in a concentration of 5 to 15 percent by weight.

In one preferred embodiment of the optoelectronic component, the particles comprise scattering particles which are designed for the scattering of the primary radiation and in this case contribute a second portion to the secondary radiation. During the interaction of electromagnetic radiation and scattering particles, the wavelength of the electromagnetic radiation is not altered. The terms scattering particles and reflection particles are used synonymously in the present application.

In one preferred embodiment, the scattering particles comprise barium sulfide and/or barium sulfite and/or barium sulfate and/or titanium dioxide. An average size of the titanium dioxide scattering particles is approximately 300 nm. The concentration of the scattering particles is between 2 and 10 percent by weight. At a concentration of greater than 5 percent by weight, the intensity of the perpendicularly emitted component of the secondary radiation is close to zero.

For the case where secondary radiation is generated, the medium comprising the scattering particles provides for a good mixing of blue and yellow light and for a suitable deflection of the primary radiation.

In one preferred embodiment, the height of the medium is between approximately 1 times and approximately 3 times the chip width of the semiconductor chip along the carrier. This is advantageous since, given the above dimensions, a particularly large amount of secondary radiation can be coupled out laterally from the optoelectronic component.

In one preferred embodiment, a reflective layer is provided, which extends at least in regions on a side of the medium which faces the semiconductor chip. This is advantageous since this prevents the secondary radiation reflected by the scattering particles and the secondary radiation emitted by the phosphor particles from being lost by absorption at the carrier.

In one preferred embodiment, a partly reflective layer is provided, which is arranged at least in regions on a side of the medium which faces away from the semiconductor chip. The partly reflective layer reflects part of the electromagnetic radiation back into the medium. In this case, the partly reflective layer does not reflect wavelengths selectively. This layer prevents parts of the secondary radiation from leaving the side of the medium which faces away from the semiconductor chip. The portion of the secondary radiation reflected back into the medium by the layer can be set by way of the content of titanium dioxide reflection particles in the layer.

In one preferred embodiment, the partly reflective layer is arranged on the side of the medium which faces away from the semiconductor chip in direct contact with the medium. This is advantageous since production is simple.

In one preferred embodiment, the reflective layer on the side of the medium which faces the semiconductor chip and/or the partly reflective layer on the side of the medium which faces away from the semiconductor chip comprise(s) silicone comprising titanium dioxide particles.

In one preferred embodiment, the optoelectronic component is optically coupled to an optical waveguide.

In one preferred embodiment, an air gap is provided between the optoelectronic component and the optical waveguide, said air gap resulting in better coupling into the guided modes of the optical waveguide.

In one embodiment of the method for producing an optoelectronic component, a semiconductor chip on a carrier is provided. Particles are introduced into a medium composed of a transparent matrix material, in particular a transparent silicone. The medium is subsequently poured into a mold. The thermal curing of the medium is then effected. The medium is then applied to the semiconductor chip in such a way that an aspect ratio of greater than 1 is achieved.

An alternative method for producing an optoelectronic component can be specified as follows. The medium together with the particles in the composite assembly is simultaneously applied to the semiconductor chip by compression molding. In this case, a mold is put in place and used to effect molding under pressure. The medium is subsequently cured.

Finally, the optoelectronic components produced by the alternative methods can be optically coupled to an optical waveguide.

The optoelectronic component produced in accordance with the above methods is cost-effective to produce and achieves high optical efficiencies. With a suitable lateral arrangement of these optoelectronic components, a planar light source can be produced in a simple manner. It is possible to achieve a homogeneous luminance in conjunction with a limited number of optoelectronic components. An efficient, rimless and self-cooling planar light source arises. The planar light source can be made very thin and can be flexible.

BRIEF DESCRIPTION OF THE DRAWINGS

FIG. 6b shows a sectional view of one exemplary embodiment of an optoelectronic component;

FIG. 7 shows a sectional view of one exemplary embodiment of a lighting device comprising two optoelectronic components;

FIG. 7b shows the simulation of the luminous distribution around the optoelectronic component in accordance with FIG. 7a;

FIG. 8b shows the simulation of the luminous distribution around the optoelectronic component in accordance with FIG. 8a;

FIG. 10b shows the simulation of the luminous distribution around the optoelectronic component in accordance with FIG. 10a;

FIG. 11 shows a sectional view of one exemplary embodiment of a lighting device comprising two optoelectronic components;

FIG. 12b shows the simulation of the luminous distribution around the optoelectronic component in accordance with FIG. 12a.

DETAILED DESCRIPTION OF THE DRAWINGS

Elements which are identical, have identical type or act identically are provided with the same reference signs in the figures. The figures and the size relationships of the elements illustrated in the figures among one another should not be regarded as to scale. Rather, individual elements may be illustrated with an exaggerated size in order to enable better illustration and in order to afford a better understanding.

Figure 1:
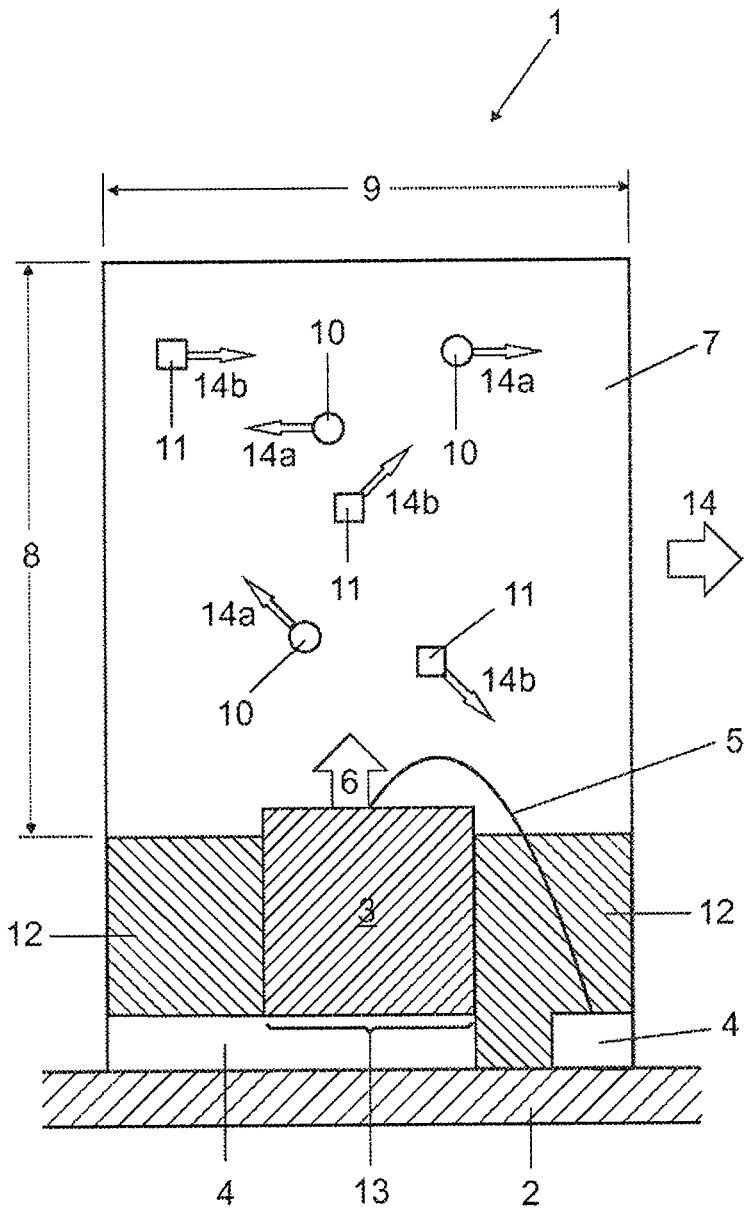
FIG. 1 shows a sectional view of one exemplary embodiment of an optoelectronic component.

FIG. 1 shows an optoelectronic component 1. A semiconductor chip 3 is applied on a carrier 2. The electrical contact-making is effected via contacts 4 and a bonding wire 5. The semiconductor chip 3 emits a primary radiation 6. The semiconductor chip 3 is at least partly enclosed by an at least partly transparent medium 7 having a height 8 above the carrier 2 and a width 9 along the carrier 2 (aspect ratio). Particles 10, 11 are introduced in the medium 7 and interact with the primary radiation 6. The medium 7 has an aspect ratio greater than 1. The particles 10, 11 are distributed homogeneously in the medium 7. The particles 10, 11 comprise phosphor particles 10 designed for an absorption of the primary radiation 6 and an emission of a first portion 14a of a secondary radiation 14. The phosphor particles 10 comprise, in particular, a phosphorescent material, such as yttrium aluminum garnet. The phosphor particles are present in a concentration of 5 to 15 percent by weight. The particles 10, 11 comprise scattering particles 11 which are designed for the scattering of the primary radiation and in this case contribute a second portion 14b to the secondary radiation 14. During the interaction with electromagnetic radiation, scattering particles 11 do not alter the wavelength of the electromagnetic radiation. The term reflection particles is synonymous with the term scattering particles 11. The scattering particles 11 comprise barium sulfide and/or barium sulfite and/or barium sulfate and/or titanium dioxide. The scattering particles are present in a concentration of 2 to 10 percent by weight. The height 8 of the medium 7 is between approximately 1 times and approximately 3 times the chip width 13 of the semiconductor chip 3 along the carrier 2. The portion of the lateral emission of the secondary radiation can be set by the height 8 of the medium 7. By way of example, a height 8 of the medium 7 of 300 μm to 900 μm is advantageous for a semiconductor chip 3 having a chip width 13 of 300 μm. A reflective layer 12 is provided at least in regions on a side of the medium 7 which faces the semiconductor chip 3. The geometry of the component is designed in such a way that the side areas of the medium 7 which are perpendicular to the carrier predominate over the surface of the medium, arranged parallel to the carrier, with regard to its area content.

Figure 2:
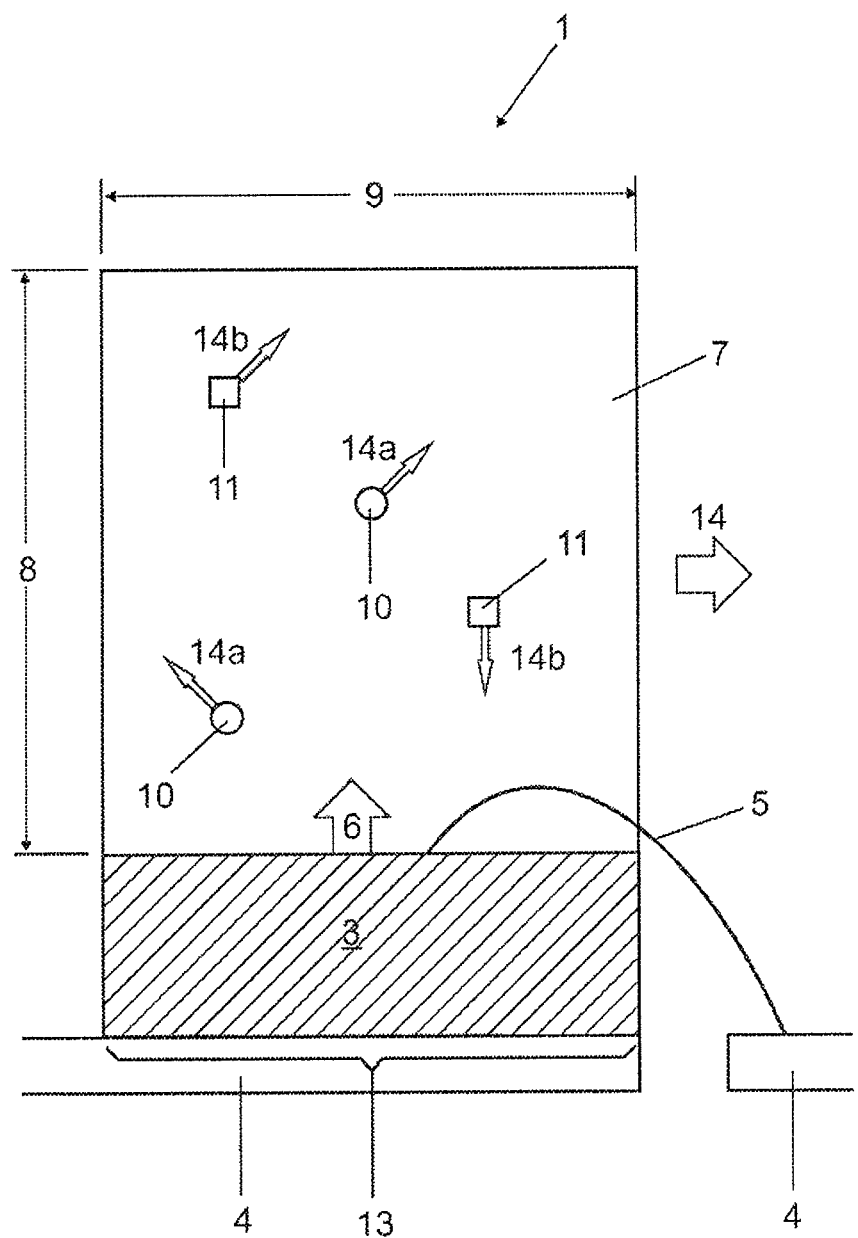
FIG. 2 shows a sectional view of one exemplary embodiment of an optoelectronic component.

FIG. 2 shows an optoelectronic component 1 in which the width 9 of the medium approximately corresponds to the width 13 of the semiconductor chip 3. The need for a reflective layer on the side of the medium 7 which faces the semiconductor chip 3 is obviated. The remaining components correspond to those from FIG. 1.

Figure 3:
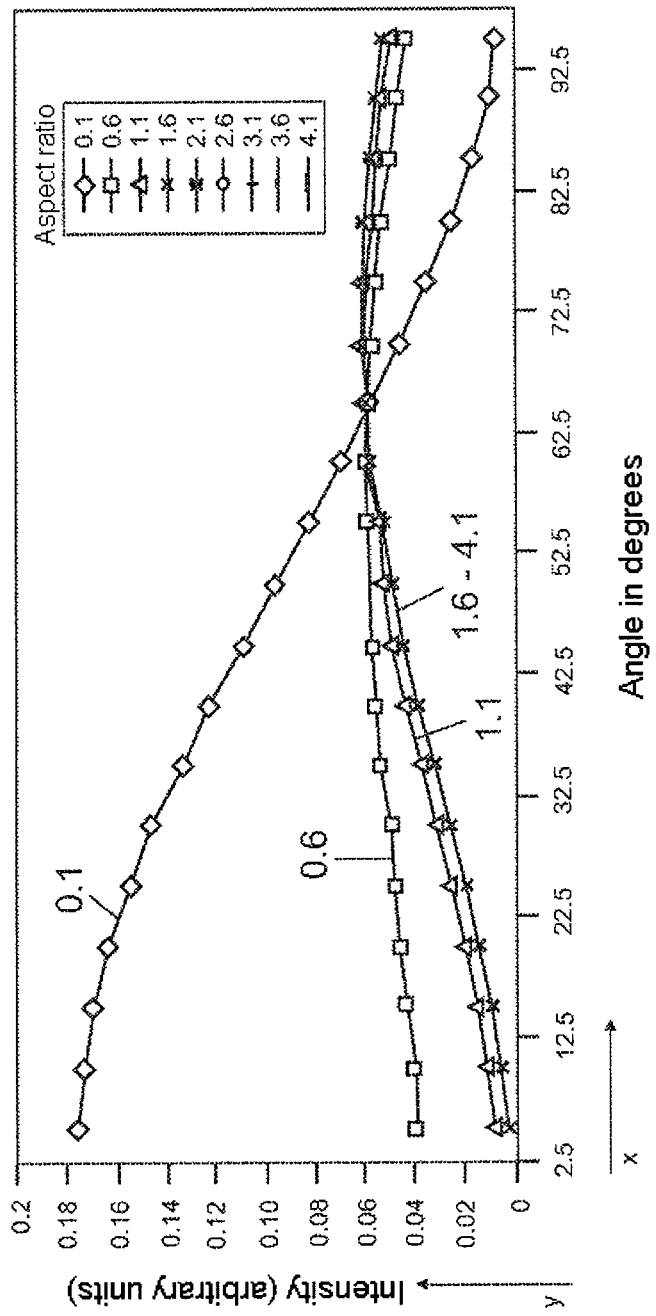
FIG. 3 shows the emission characteristic of an optoelectronic component for different aspect ratios.

FIG. 3 shows the calculated emission characteristic for different aspect ratios for a medium 7 filled with phosphor particles 10. In the present case, the medium 7 is a silicone layer; in the present case, the phosphor particles 10 are phosphorescent materials. The emission characteristic is illustrated for different values of the aspect ratios between 0.1 and 4.1. The emission angle is plotted on the abscissa x and the intensity of the secondary radiation 14 is plotted on the ordinate y. Given an aspect ratio of 0.1, the intensity emitted by the optoelectronic component is maximal at small angles. For aspect ratios of 1.1 and higher, the emitted intensity falls to vanishing values at small angles. The intensity of the secondary radiation 14 attains maximum values in the angle range of between 60 and 90 degrees. In other words, the lateral emission is greatly promoted. The angle distribution can also be influenced by the particle concentration besides the aspect ratio.

Figure 4:
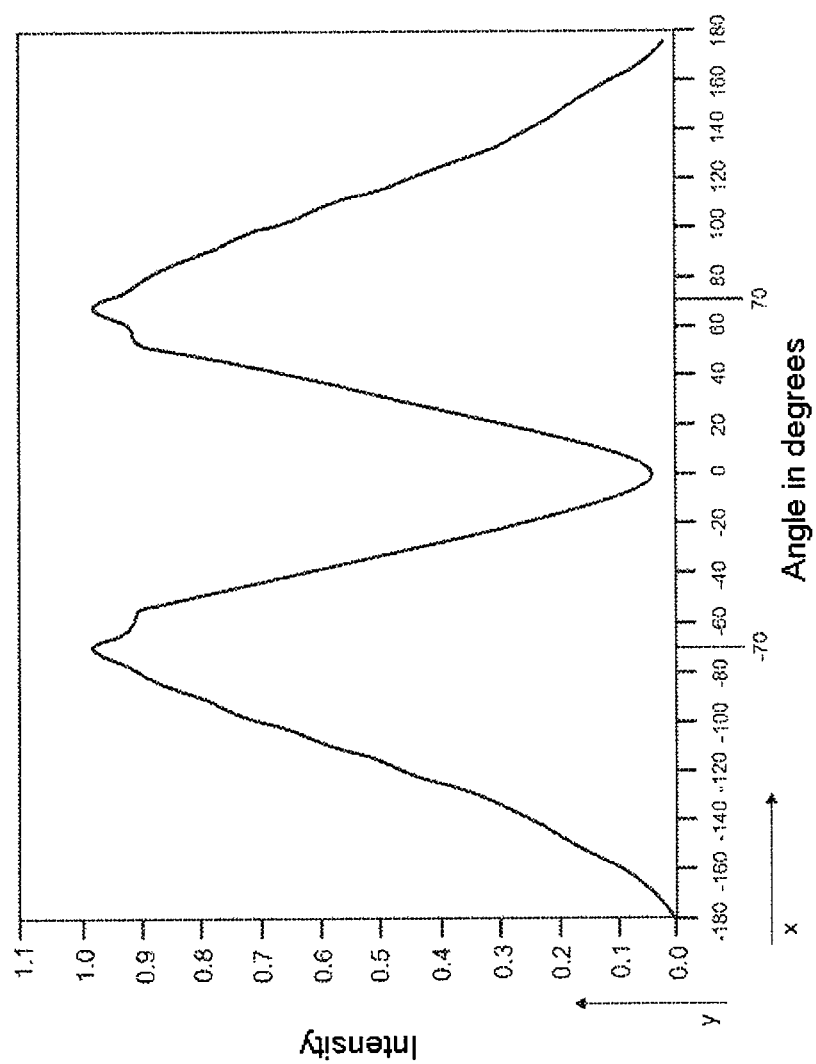
FIG. 4 shows an emission characteristic of an optoelectronic component as a function of the angle.

FIG. 4 shows a typical emission characteristic of an optoelectronic component 1 as a function of the angle. Angles of between −180 degrees and +180 degrees are plotted on the x-axis. The angle of 0 degrees corresponds to the normal to the side of the medium 7 which faces away from the semiconductor chip 3. The intensity maxima are at an angle of approximately −70 degrees and approximately +70 degrees. The intensity virtually vanishes at an angle of 0 degrees.

Figure 5:
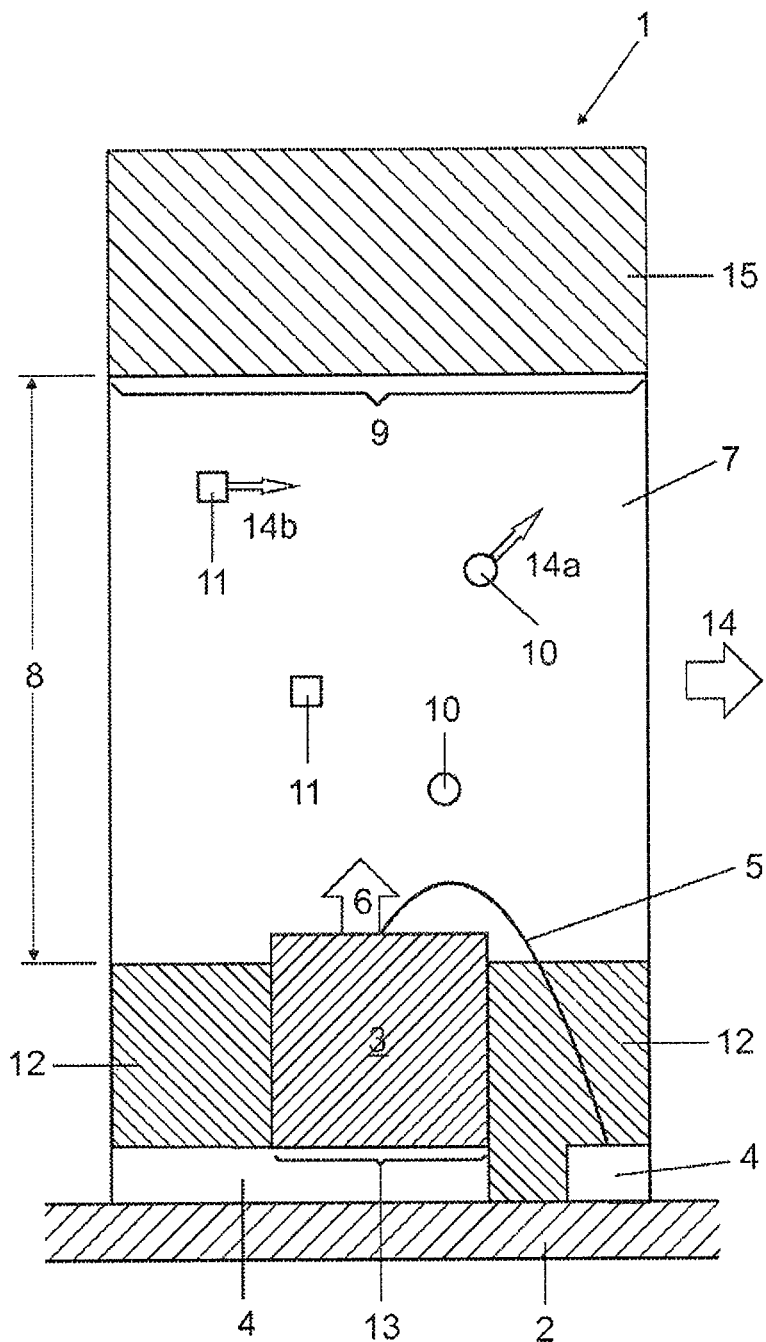
FIG. 5 shows a sectional view of one exemplary embodiment of an optoelectronic component.

FIG. 5 shows an optoelectronic component comprising a partly reflective layer 15, which is provided at least in regions on a side of the medium 7 which faces away from the semiconductor chip 3. The partly reflective layer 15 is arranged on the side of the medium 7 which faces away from the semiconductor chip 3 in direct contact with the medium 7. The partly reflective layer 15 can be a silicone filled with titanium dioxide particles. The partly reflective layer 15 reflects secondary radiation from the entire visible spectral range. In particular, no wavelength-dependent reflection takes place. In other words, the secondary radiation is not filtered with respect to the wavelength. The partly reflective layer 15 serves for setting the balance between frontal emission and side emission. Depending on the concentration of the titanium dioxide particles, the first and second portions 14a and 14b of the secondary radiation 14 are reflected to a greater or lesser extent. In a limiting case, the perpendicular emission—that is to say emission normal to the side of the medium 7 which lies opposite the semiconductor chip 3—of secondary radiation 14 can be completely prevented. In other words, the frontal emission is suppressed in favor of the lateral emission. The undesired yellowish color impression brought about by the phosphor particles is avoided by means of the partly reflective, white layer 15. The remaining components correspond to those in figure FIG. 1.

Figure 6A:
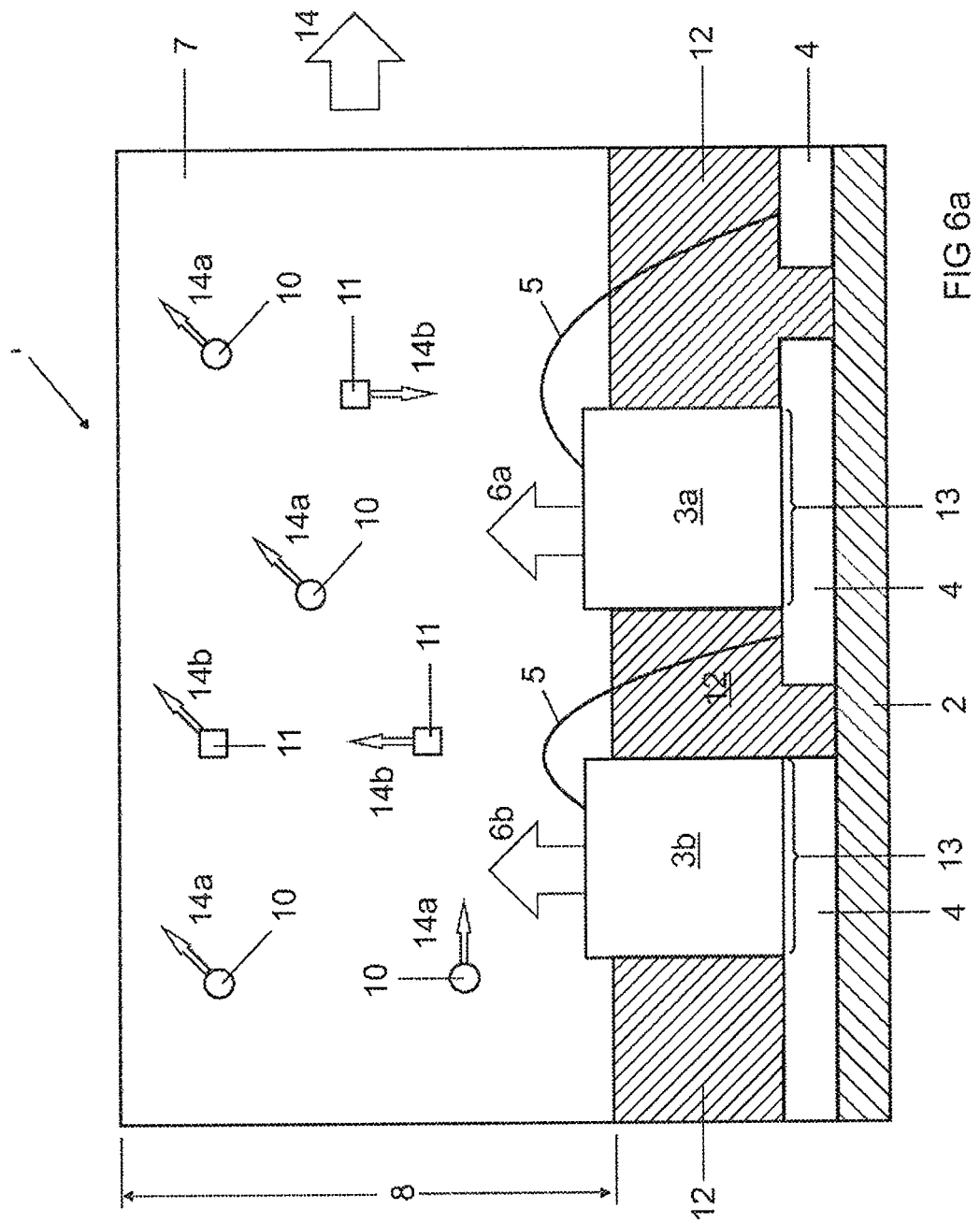
FIG. 6a shows a sectional view of one exemplary embodiment of an optoelectronic component.

FIG. 6a shows two semiconductor chips 3a and 3b within an optoelectronic component 1. Once again the height 8 of the medium 7 is between 1 times and 3 times the chip width 13. In the present exemplary embodiment, the medium contains both phosphor particles 10 and scattering particles 11. The scattering particles 11 bring about a mixing of the primary radiation 6a and 6b with the first portion 14a of the secondary radiation. The primary radiation 6a is the electromagnetic radiation having a first wavelength emitted by a first semiconductor chip 3a. The primary radiation 6b is the electromagnetic radiation having a second wavelength emitted by a second semiconductor chip 3b. The first portion 14a of the secondary radiation is light converted by phosphor particles 10. Furthermore, the scattering particles 11 provide for the desired, namely lateral, emission characteristic. The rest of the components correspond to those in FIG. 1.

FIG. 6b shows, like FIG. 6a already, two semiconductor chips 3a and 3b within an optoelectronic component 1. In contrast to FIG. 6a, exclusively scattering particles 11 are introduced in the medium 7. Wavelength conversion does not take place without phosphor particles 10. Therefore, only color mixing and lateral deflection of the primary radiation 6 take place in the medium 7. The desired spectrum is achieved by means of the different wavelengths of the first portion 6a of the primary radiation and of the second portion 6b of the primary radiation. The rest of the components correspond to those in FIG. 1.

In an exemplary embodiment which is not shown, an optoelectronic component is provided which comprises at least three semiconductor chips which emit in the red, green and blue spectral range. A wavelength conversion by means of phosphor particles 10 is not necessary. As already in the exemplary embodiment in FIG. 6b, it is only necessary to achieve light mixing and a setting of the emission characteristic by means of the scattering particles 11. The rest of the components correspond to those in FIG. 6b.

Figure 7A:
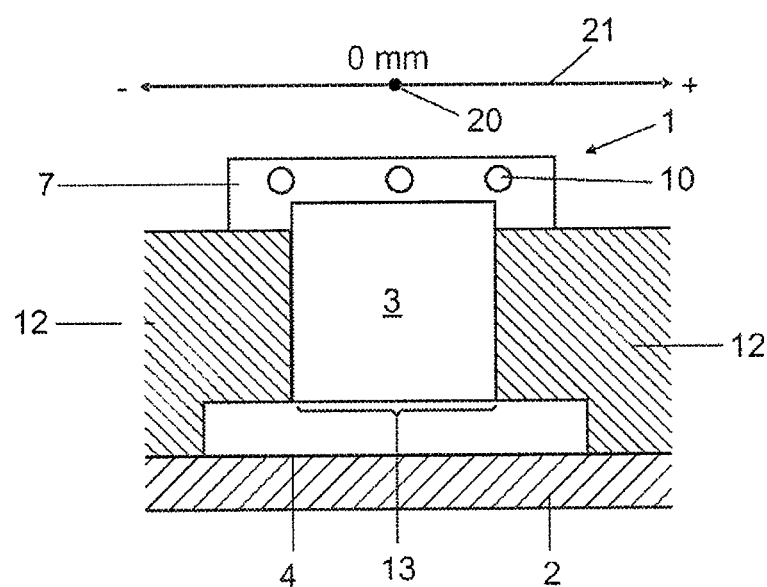
FIG. 7a shows one of the two optoelectronic components from FIG. 7.
Figure 7B:
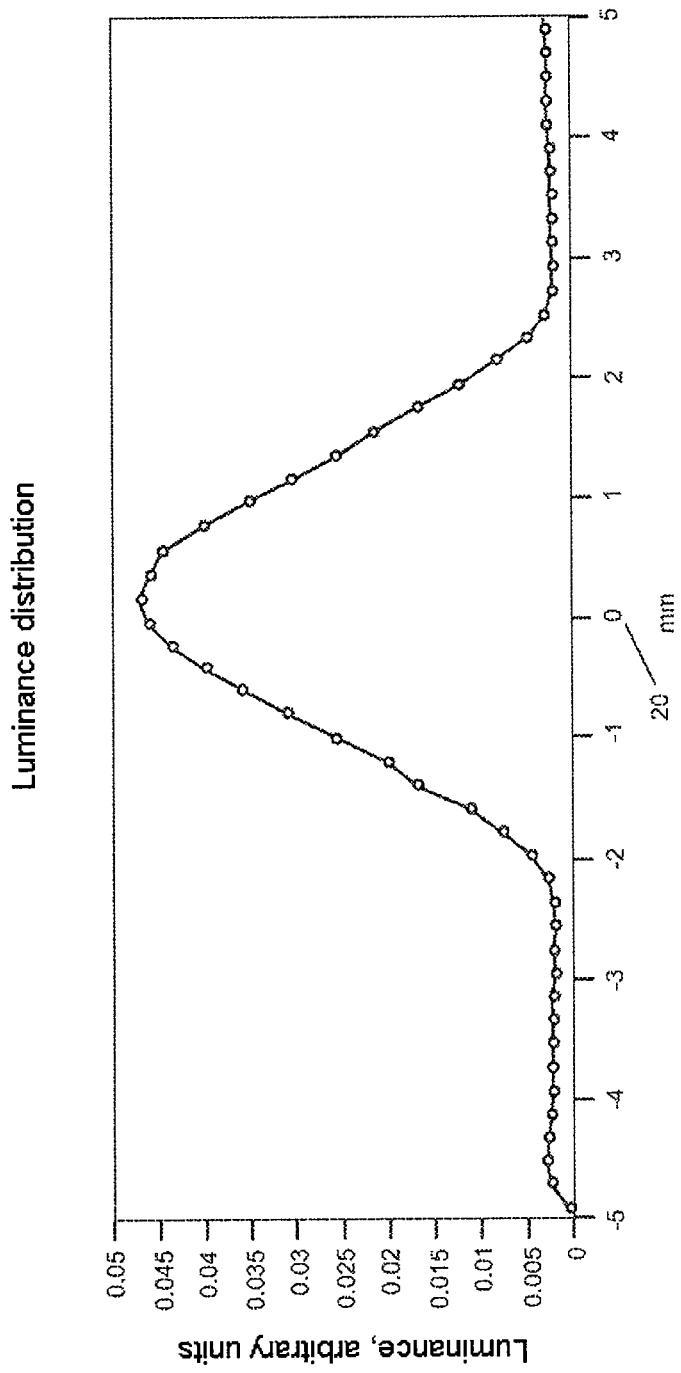

FIG. 7 should be seen as a reference of a lighting device. FIG. 7 illustrates white LEDs with chip level conversion, which are embedded in an optical waveguide 17. The white LED has a semiconductor chip 3, which emits a primary radiation 6, and a thin medium 7 placed onto the semiconductor chip 3 and having a typical thickness of approximately 30 μm. In other words, the height 8 of the medium 7 is only a fraction of the chip width 13 of the semiconductor 3. The side areas of the medium 7, perpendicular to the carrier 2 are small in comparison with the surface of the medium 7, arranged parallel to the carrier 2. The thin medium 7 contains phosphor particles 10 for wavelength conversion. A reflective layer 12 surrounding the semiconductor chips 3 is provided in order to increase the efficiency. The white LED has an approximately Lambertian emission profile. The small thickness of the medium 7 results in for the most part forward directed emission. This has the consequence that only very little electromagnetic radiation is coupled into the optical waveguide, while most of the light is emitted directly frontally and in a punctiform fashion above the semiconductor chip 3. In a series arrangement of optoelectronic components in the optical waveguide 17, a very inhomogeneous luminance distribution is the consequence. These disadvantages are overcome most clearly by the exemplary embodiments shown in FIGS. 8, 11 and 12. The zero point 20 for the luminance distribution illustrated in FIG. 7b lies centrally above the respective optoelectronic component 1.

FIG. 7a shows one of the two optoelectronic components 1 illustrated in FIG. 7. Both components 1 are identical. Therefore, the same luminance distribution holds true for both components 1. The zero point 20 of the luminance distribution is at 0 mm and lies centrally above the optoelectronic component 1. The horizontal axis 21 with the position of the zero point 20 is indicated for orientation purposes.

FIG. 7b shows a simulation of the luminance distribution for the optoelectronic component 1 illustrated in FIG. 7a. At the zero point 20, the luminance is maximal and is above 0.045 (in arbitrary units). On both sides (+2 mm to −2 mm) of the zero point 20, the luminance falls within 2 mm to below 0.005 (in arbitrary units). A Lambertian radiation profile is evident. As already described in FIG. 7, therefore, the optoelectronic component shown in FIG. 7a is scarcely suitable for laterally coupling light into an optical waveguide 17.

Figure 8:
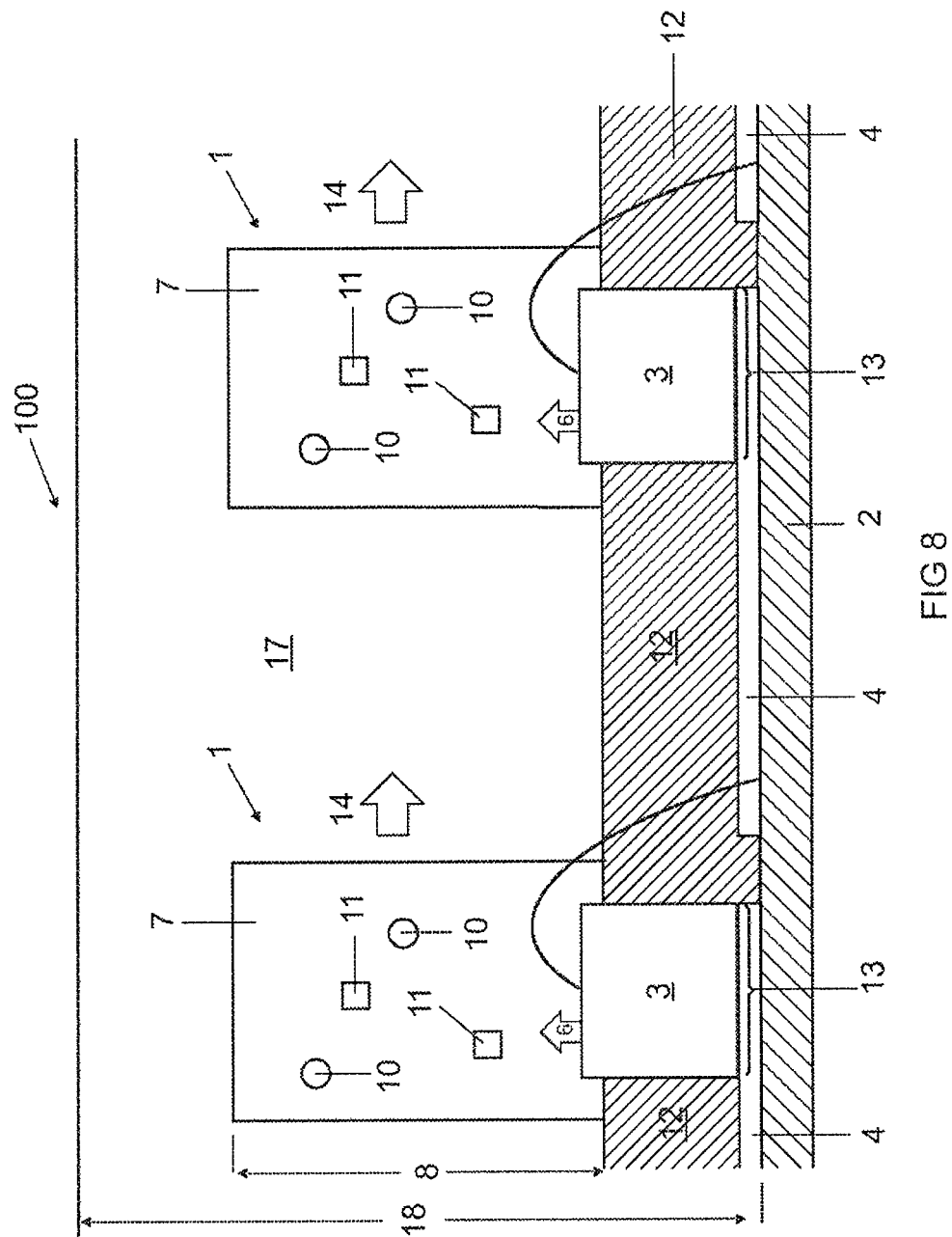
FIG. 8 shows a sectional view of one exemplary embodiment of a lighting device comprising two optoelectronic components.

FIG. 8 shows an arrangement 100 composed of an optical waveguide 17 with two embedded optoelectronic components 1. The distance between the semiconductor chips 3 is approximately 10 mm, the height 18 of the optical waveguide 17 is approximately 2 mm and the height 8 of the medium 7 is approximately 1.5 mm. The optimum distance between the semiconductor chips 3 is determined according to the following criteria. A planar light source having homogeneous luminance and optimal heat dissipation is produced by as many semiconductor chips 3 as necessary. For cost reasons, as few semiconductor chips 3 as possible are intended to be used for the required quantity of light. Overall, it is expedient to use more semiconductor chips 3 with less individual power for optimum thermal management. Light generation and heat generation are intended to be spread. The optoelectronic components correspond to those from FIG. 1. The embedding into the optical waveguide 17 serves for the lateral distribution of the secondary radiation 14. A homogeneous light distribution is thereby achieved. This gives a high-quality optical impression which is necessary, in particular, for backlighting applications. In FIG. 7, which serves as a reference, only very little secondary radiation 14 is laterally coupled into the optical waveguide 17. Most of the secondary radiation is emitted directly frontally and in a punctiform fashion. In the exemplary embodiment in FIG. 8, by contrast, an increased lateral emission takes place. As a result, the width of the luminous spot can be approximately doubled by comparison with the arrangement in FIG. 7. Instead of approximately 2 mm, a width of 4 mm is achieved. This affords the possibility, with the same optical waveguide thickness, of reducing the number of optoelectronic components 1 to one quarter in relation to the reference. Furthermore, the homogeneity of the luminance is greatly improved and the luminance contrast between the maximum intensity and the background is reduced to a factor of 3. In the reference example illustrated in FIG. 7, said factor is approximately 20.

Figure 8A:
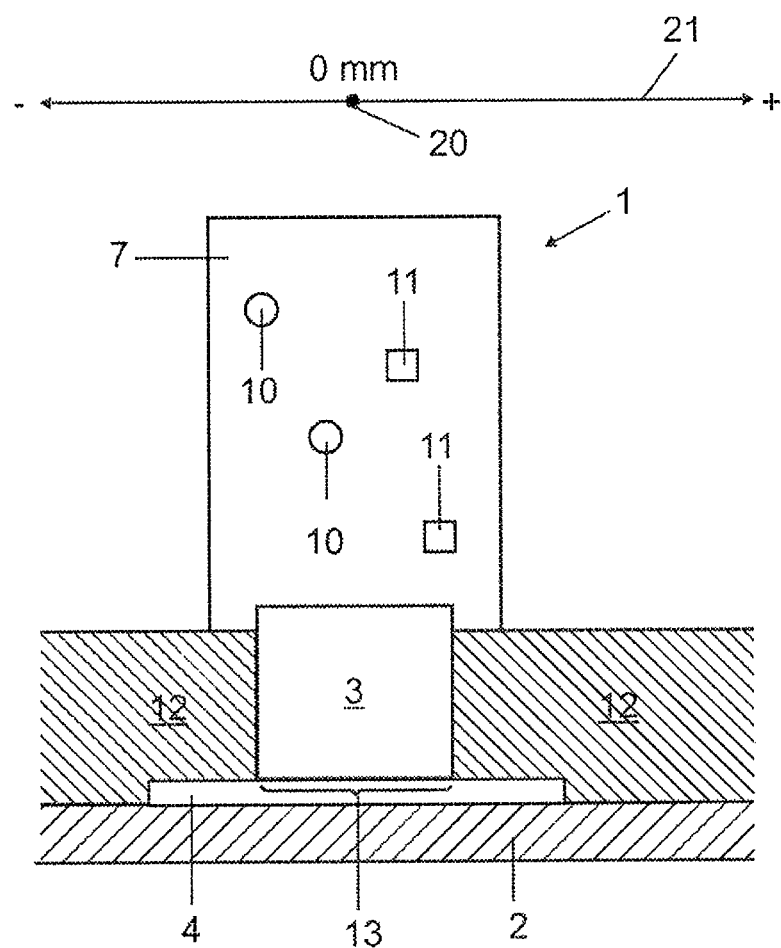
FIG. 8a shows one of the two optoelectronic components from FIG. 8.

FIG. 8a shows one of two optoelectronic components 1 illustrated in FIG. 8. Both components 1 are identical. Therefore, the same luminance distribution holds true for both components 1. The zero point 20 of the luminance distribution is at 0 mm and lies centrally above the optoelectronic component 1. The horizontal axis 21 with the position of the zero point 20 is indicated for orientation purposes.

Figure 8B:
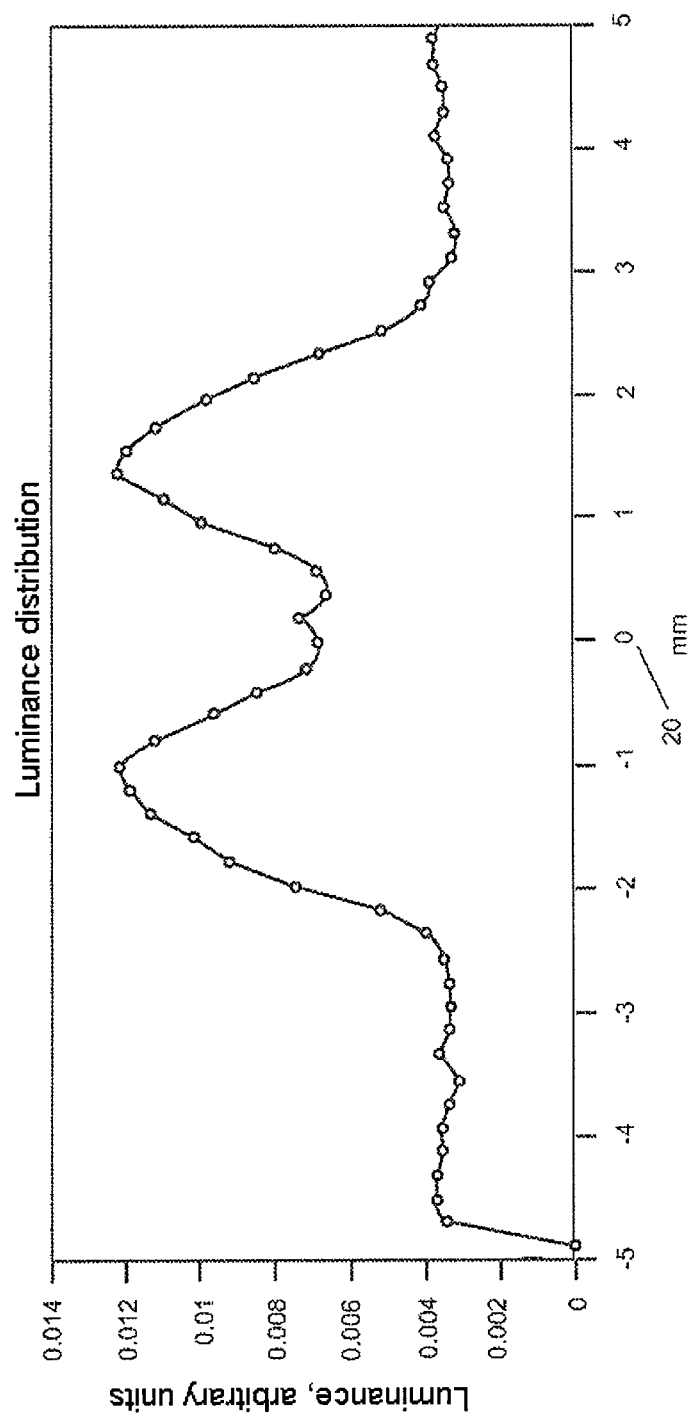

FIG. 8b shows the simulated luminance distribution for the optoelectronic component 1 illustrated in FIG. 8a. At the zero point 20, the luminance is between 0.006 and 0.008. At a distance of approximately 1 mm from the zero point 20, the luminance is approximately 0.012. The maximum luminance is no longer emitted centrally above the semiconductor chip, but rather laterally. At a distance of approximately 3 mm from the zero point 20, the luminance has fallen to below 0.004. The light preferably emitted in a lateral direction is expedient for lateral coupling into a waveguide 17.

Figure 9:
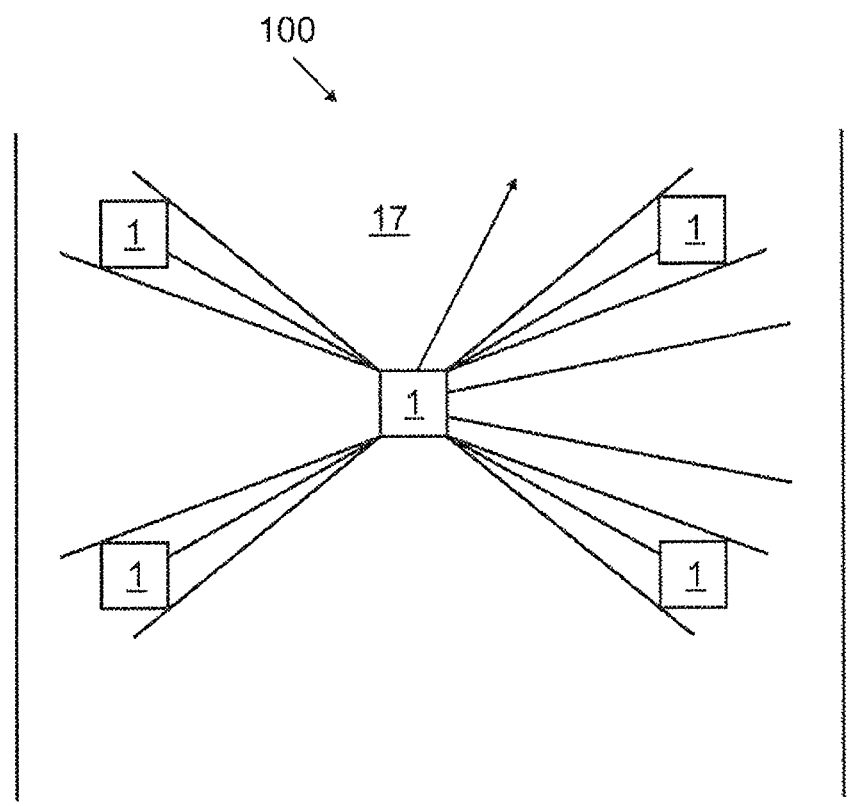
FIG. 9 shows a plan view of one exemplary embodiment of a lighting device comprising a plurality of optoelectronic components.

FIG. 9 shows an arrangement 100 composed of an optical waveguide 17 with embedded optoelectronic components 1. This illustrates that the arrangement 100 is an areal configuration. This illustration makes it clear that the mutual shading by the optoelectronic components 1 is negligibly small.

Figure 10:
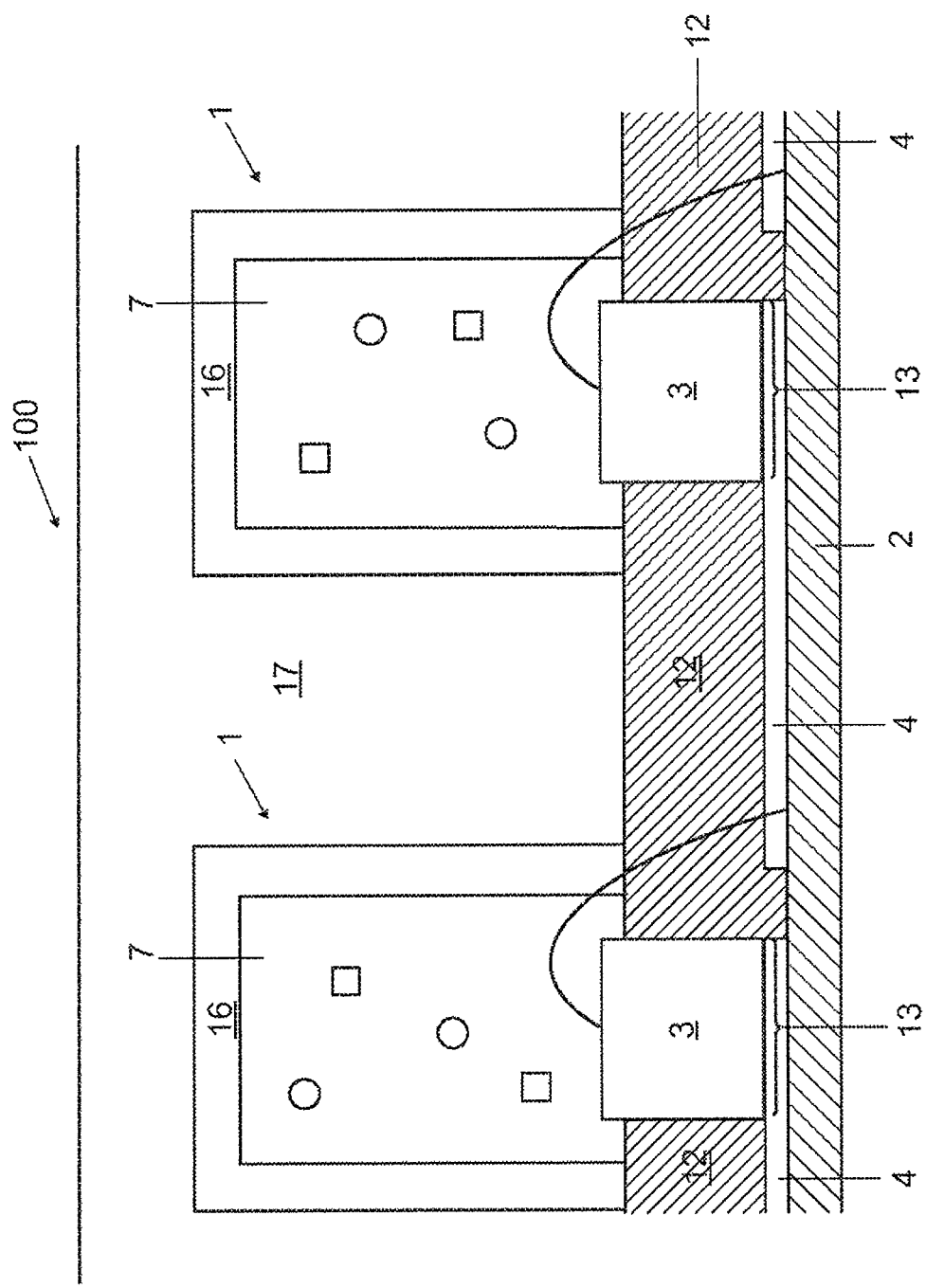
FIG. 10 shows a sectional view of one exemplary embodiment of a lighting device comprising two optoelectronic components.

FIG. 10 shows, like FIG. 8 already, an arrangement 100 composed of an optical waveguide 17 with embedded optoelectronic components 1. Unlike in FIG. 8, an air gap 16 is provided around the optoelectronic component 1 and results in better coupling of the secondary radiation 14 into the guided modes of the optical waveguide 17. The secondary radiation 14 is coupled out by means of an additional scattering mechanism in the volume or at the surface of the optical waveguide 17. This improves the homogeneity of the luminance in large regions.

Figure 10A:
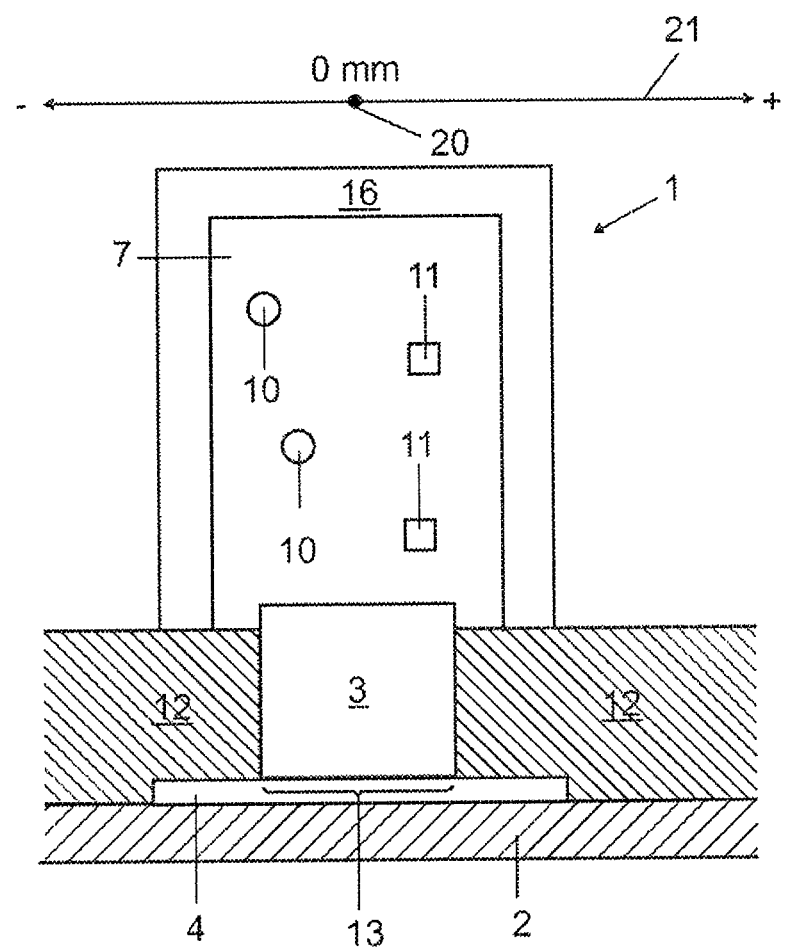
FIG. 10a shows one of the two optoelectronic components from FIG. 10.

FIG. 10*a* shows one of the two optoelectronic components 1 illustrated in FIG. 10. Both components 1 are identical. Therefore, the same luminance distribution holds true for both components 1. The zero point 20 of the luminance distribution is at 0 mm and lies centrally above the optoelectronic component 1. The horizontal axis 21 with the position of the zero point 20 is indicated for orientation purposes.

Figure 10B:
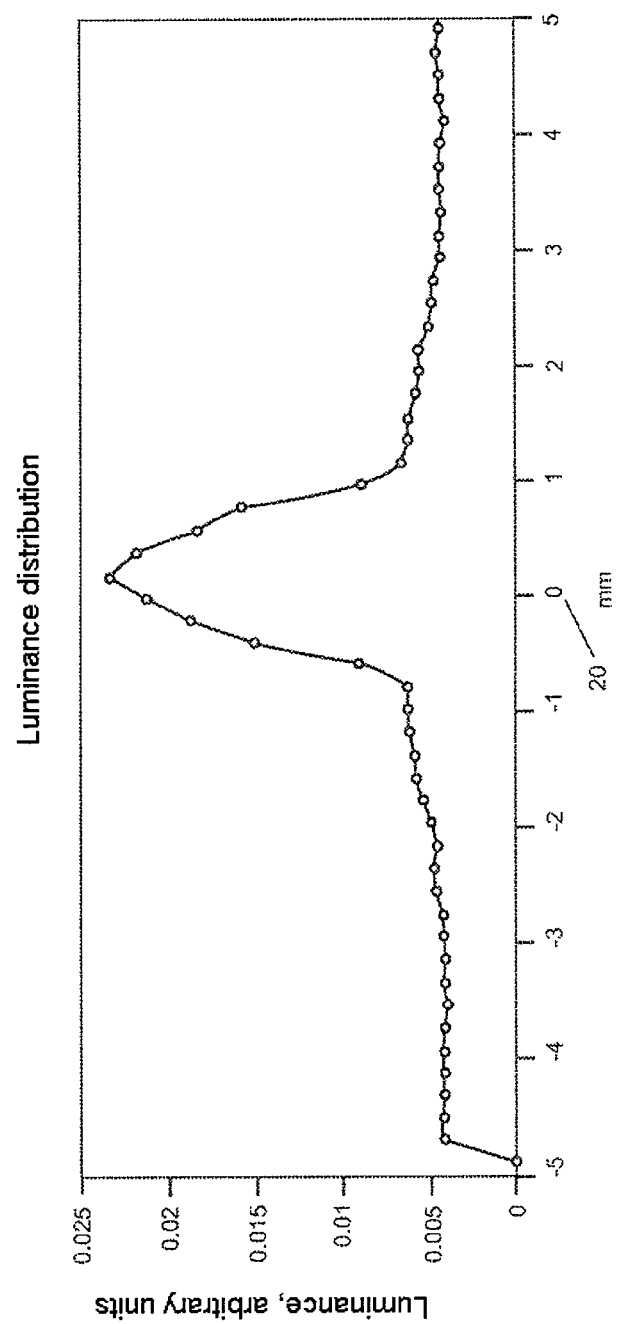

FIG. 10*b* shows the simulated luminance distribution for the optoelectronic component 1 illustrated in FIG. 10*a*. At the zero point 20, the luminance is between 0.02 and 0.025. At a distance of approximately 1 mm from the zero point 20, the luminance has fallen to approximately 0.006. The maximum luminance is emitted centrally above the semiconductor chip. At a distance of approximately 2 mm to approximately 5 mm from the zero point 20, the luminance is approximately constant at approximately 0.004.

FIG. 11 shows an exemplary embodiment which is even more advantageous than the one illustrated in FIG. 10. In order to prevent the punctiform emission of the secondary radiation 14, a semitransparent or partly reflective layer 15 is additionally arranged at that side of the medium 7 which faces away from the semiconductor chip 3. This leads to a homogenization of the secondary radiation 14. The air gap 16 lies between the medium 7 with the partly reflective layer 15 and the waveguide 17.

Figure 11A:
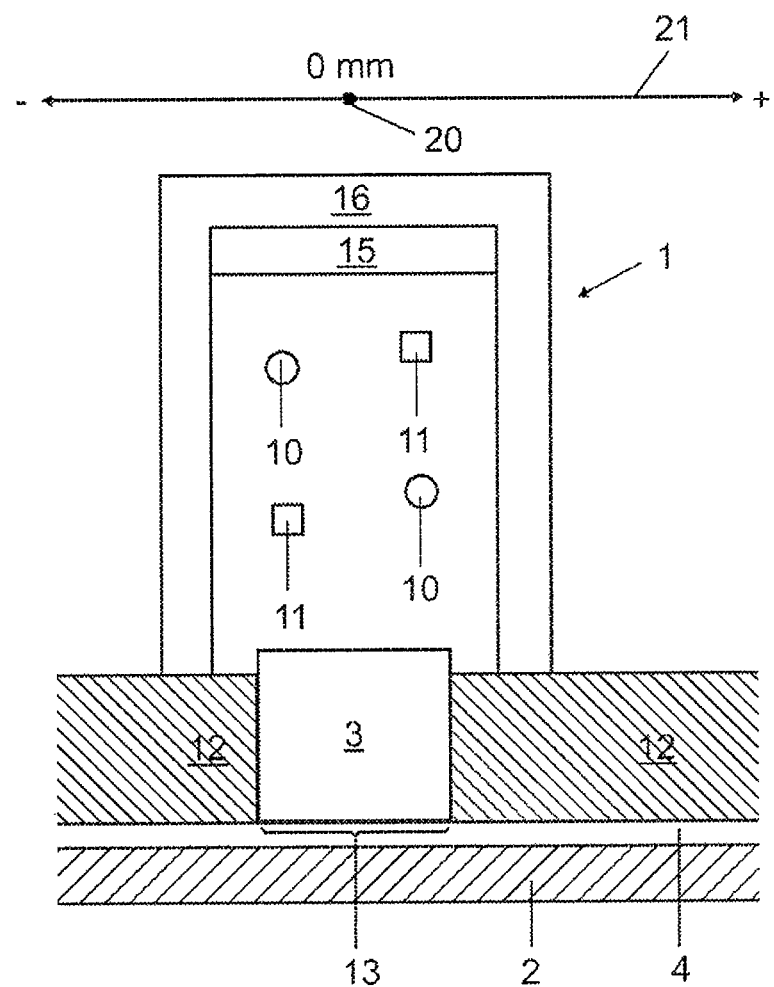
FIG. 11a shows one of the two optoelectronic components from FIG. 11.

FIG. 11*a* shows one of the two optoelectronic components 1 illustrated in FIG. 11. Both components 1 are identical. Therefore, the same luminance distribution holds true for both components 1. The zero point 20 of the luminance distribution is at 0 mm and lies centrally above the optoelectronic component 1. The horizontal axis 21 with the position of the zero point 20 is indicated for orientation purposes.

Figure 11B:
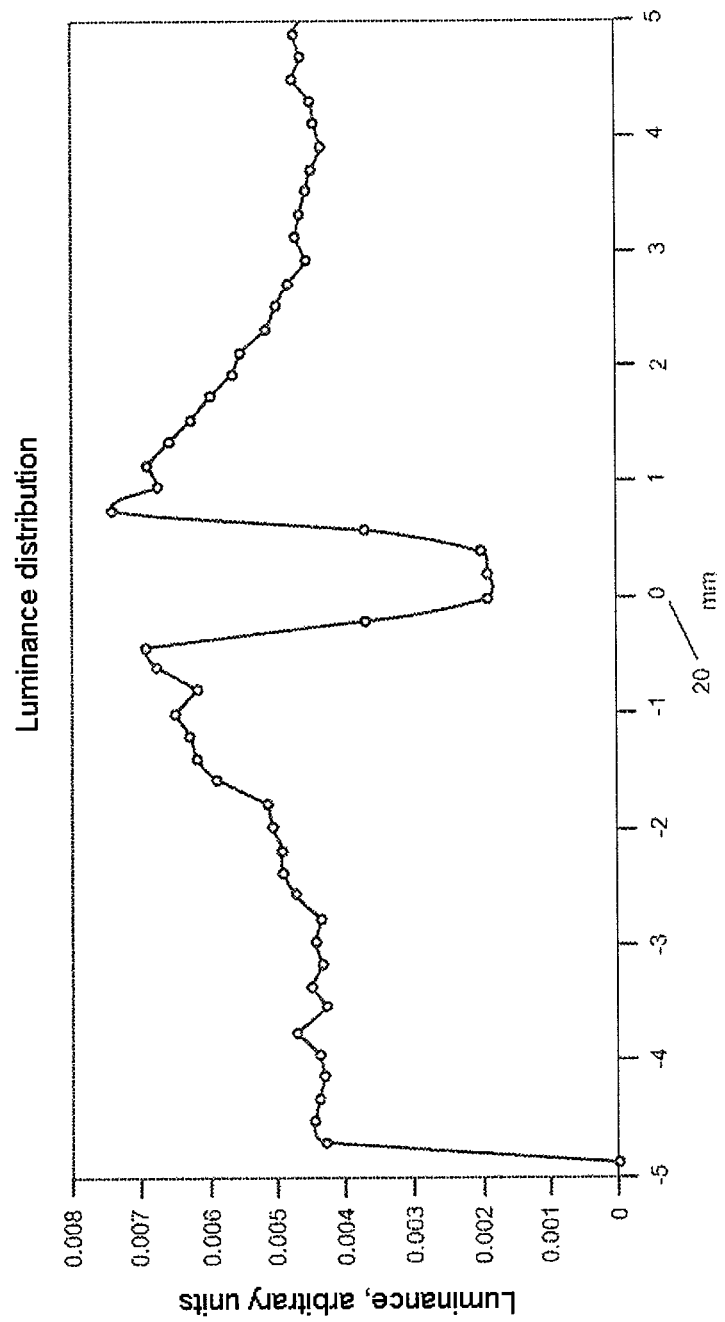
FIG. 11b shows the simulation of the luminous distribution around the optoelectronic component in accordance with FIG. 11.

FIG. 11*b* shows the simulated luminance distribution for the optoelectronic component 1 illustrated in FIG. 11*a* for the case of a partly transparent layer 15 having approximately 95% reflection. At the zero point 20, the luminance is approximately 0.002. At a distance of approximately 1 mm from the zero point 20, the luminance has increased to approximately 0.007. At a distance of 1 mm to 5 mm from the zero point 20, the luminance slowly falls to approximately 0.0045. Therefore, the maximum luminance is not achieved in a central direction above the zero point 20, but rather laterally from the zero point 20. The component from FIG. 11*a* is therefore well suited to laterally coupling the electromagnetic radiation into a waveguide 17. The homogeneity of the luminance can be further optimized by a suitable choice of the reflectance of the partly transparent layer 15.

Figure 12:
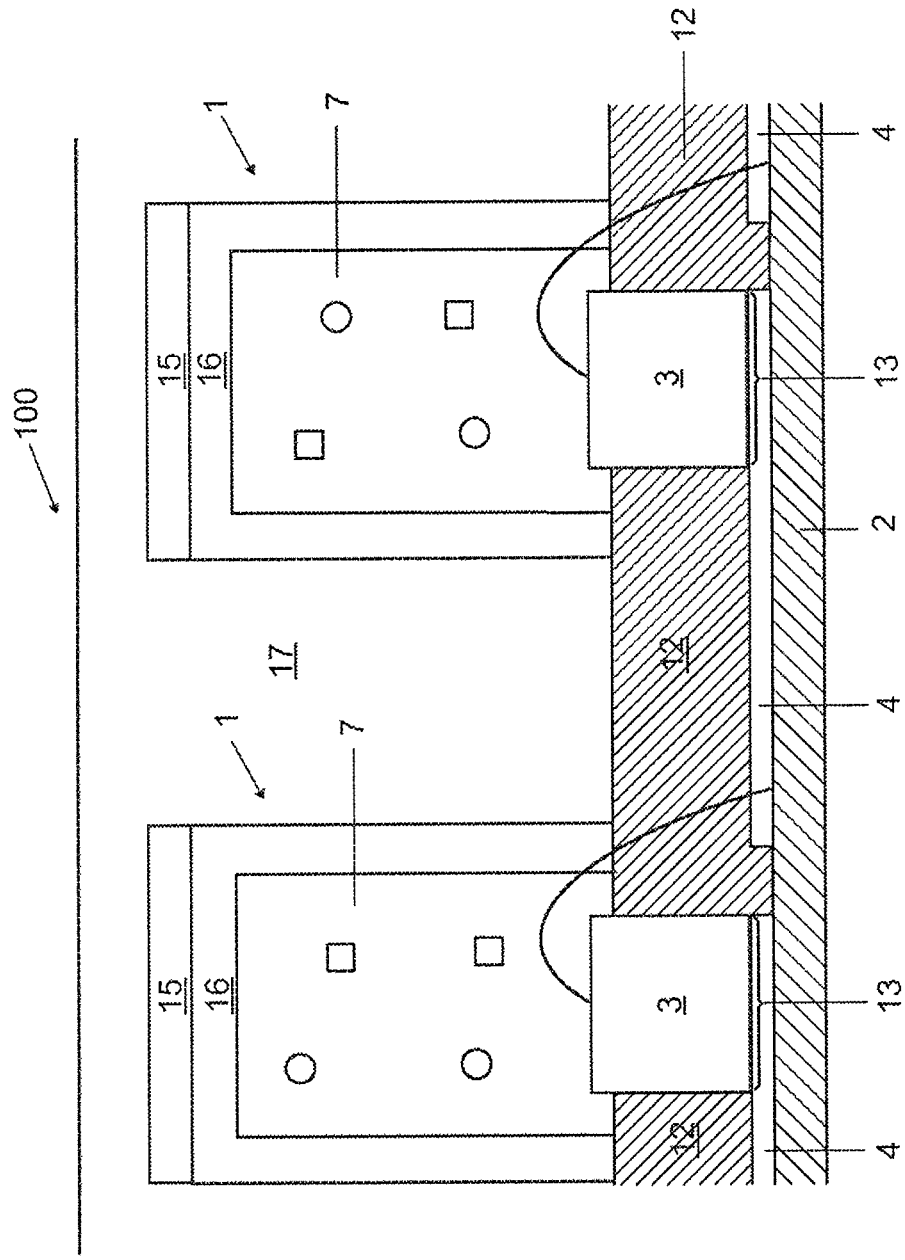
FIG. 12 shows a sectional view of one exemplary embodiment of a lighting device comprising optoelectronic components.

As an alternative embodiment in FIG. 11, the partly reflective layer 15 can be fitted to the inner side of the cutouts in the optical waveguide 17. This is shown in FIG. 12. In comparison with the exemplary embodiment from FIG. 11, the homogeneity of the luminance can be further optimized by the exemplary embodiment from FIG. 12. The air gap 16 lies between medium 7 and waveguide 17 with partly reflective layer 15 fixed thereto.

Figure 12A:
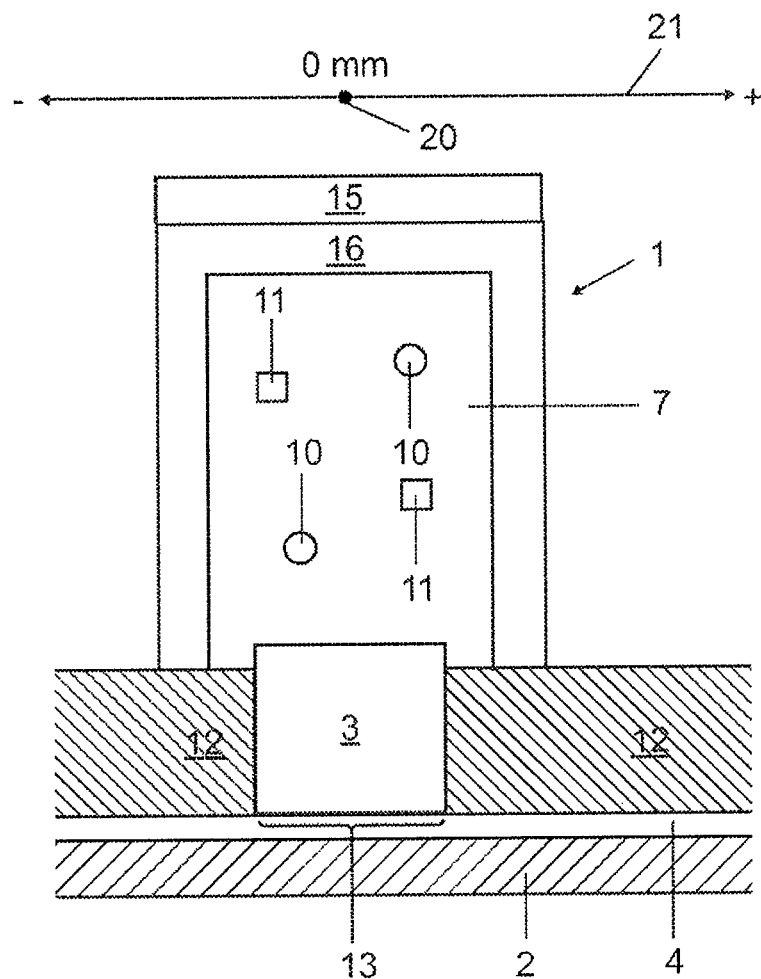
FIG. 12a shows one of the two optoelectronic components from FIG. 12.

FIG. 12*a* shows one of the two optoelectronic components 1 illustrated in FIG. 12. Both components 1 are identical. Therefore, the same luminance distribution holds true for both components 1. The zero point 20 of the luminance distribution is at 0 mm and lies centrally above the optoelectronic component 1. The horizontal axis 21 with the position of the zero point 20 is indicated for orientation purposes.

Figure 12B:
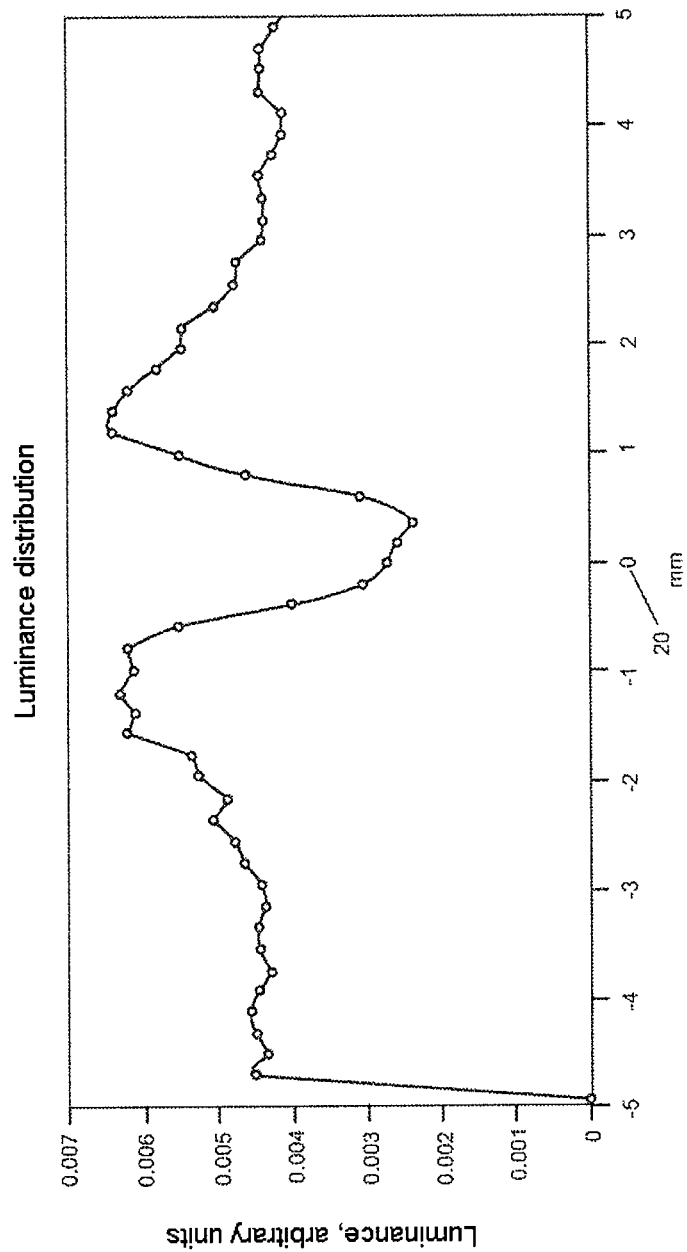

FIG. 12*b* shows the simulated luminance distribution for the optoelectronic component 1 illustrated in FIG. 12*a* for the case of a partly transparent layer 15 having approximately 60% reflection. At the zero point 20, the luminance is approximately 0.0055. At a distance of approximately 1 mm from the zero point 20, the luminance has slightly increased to approximately 0.006. At a distance of 1.5 mm to 5 mm from the zero point 20, the luminance slowly falls to approximately 0.0045. The maximum luminance is therefore not attained in a central direction above the zero point 20, but rather laterally from the zero point 20. To an approximation, however, the luminance is homogeneously distributed in a region of 5 mm on both sides of the zero point 20. Therefore, the component from FIG. 12*a* is particularly well suited to laterally coupling the electromagnetic radiation into a waveguide 17. As shown, the homogeneity of the luminance can be optimized by a suitable choice of the reflectance of the partly transparent layer 15.

The optoelectronic component has been described on the basis of some exemplary embodiments in order to illustrate the underlying concept. In this case, the exemplary embodiments are not restricted to specific combinations of features. Even if some features and configurations have been described only in connection with a particular exemplary embodiment or individual exemplary embodiments, they can in each case be combined with other features from other exemplary embodiments. It is likewise conceivable, in exemplary embodiments, to omit or add individual presented features or particular configurations, insofar as the general technical teaching remains realized.

The invention claimed is:

1. An optoelectronic component comprising:
   a carrier;
   at least one semiconductor chip, arranged on the carrier, for emitting a primary radiation;
   an at least partly transparent medium at least partly enclosing the semiconductor chip and having a height above the carrier and a width along the carrier; and
   particles introduced in the medium and serving for interaction with the primary radiation,
   wherein the medium has a ratio of the height to the width of greater than 1;
   wherein a partly reflective layer is provided at least in regions on a side of the medium which faces away from the semiconductor chip; and
   wherein the partly reflective layer suppresses frontal emission from the side of the medium which faces away from the semiconductor chip in favor of lateral emission from the medium.

2. The optoelectronic component as claimed in claim 1, wherein the particles are distributed homogeneously in the medium.

3. The optoelectronic component as claimed in claim 1, wherein the particles comprise phosphor particles designed for an absorption of the primary radiation and an emission of a first portion of a secondary radiation.

4. The optoelectronic component as claimed in claim 3, wherein the phosphor particles are composed of a phosphorescent material composed of lanthanum-doped yttrium oxide ($Y_2O_3$—$La_2O_3$), yttrium aluminum garnet ($Y_3Al_5O_{12}$), dysprosium oxide ($Dy_2O_3$), aluminum oxynitride ($Al_{23}O_{27}N_5$) or aluminum nitride (AlN), and are present in a concentration of 5 to 15 percent by weight.

5. The optoelectronic component as claimed in claim 1, wherein the particles comprise scattering particles which are designed for the scattering of the primary radiation and in this case contribute a second portion to the secondary radiation.

6. The optoelectronic component as claimed in claim 5, wherein the scattering particles are barium sulfide, barium sulfite, barium sulfate or titanium dioxide, and have a concentration of 2 to 10 percent by weight.

7. The optoelectronic component as claimed in claim 1, wherein the height of the medium is between approximately 1 times and approximately 3 times a chip width of the semiconductor chip along the carrier.

8. The optoelectronic component as claimed in claim 1, wherein a reflective layer is provided at least in regions on a side of the medium which faces the semiconductor chip.

9. The optoelectronic component as claimed in claim 8, wherein the reflective layer on the side of the medium which faces the semiconductor chip and/or the partly reflective layer on the side of the medium which faces away from the semiconductor chip comprise(s) a silicone comprising titanium dioxide particles.

10. The optoelectronic component as claimed in claim 1, wherein the partly reflective layer is arranged on the side of the medium which faces away from the semiconductor chip, and the partly reflective layer is in direct contact with the medium.

11. The optoelectronic component as claimed in claim 1, wherein an air gap is provided between the partly reflective layer on the side of the medium which faces away from the semiconductor chip and the medium.

12. The optoelectronic component as claimed in claim 1, wherein the partly reflective layer reflects secondary radiation from an entire visible spectral range.

13. A lighting device comprising at least one optoelectronic component as claimed in claim 1, wherein the optoelectronic component is optically coupled to an optical waveguide.

14. The lighting device as claimed in claim 13, wherein an air gap is provided between the optoelectronic component and the optical waveguide.

15. A method for producing an optoelectronic component comprising the following method steps:
    providing a semiconductor chip on a carrier;
    introducing particles into a medium composed of a transparent matrix material;
    pouring the medium into a mold;
    thermally curing the medium;
    applying the medium to the semiconductor chip such that a ratio of a height of the medium above the carrier to a width of the medium along the carrier is greater than 1; and
    providing a partly reflective layer at least in regions on a side of the medium which faces away from the semiconductor chip,
    wherein the partly reflective layer comprises titanium dioxide reflective particles; and
    wherein the partly reflective layer suppresses frontal emission from the side of the medium which faces away from the semiconductor chip in favor of lateral emission from the medium, and a defined portion of the secondary radiation reflected back into the medium by the partly reflective layer is set by way of the content of titanium dioxide reflection particles in the layer.

16. The method for producing an optoelectronic component as claimed in claim 15, wherein the partly reflective layer reflects secondary radiation from an entire visible spectral range.

17. An optoelectronic component comprising:
    a carrier;
    at least one semiconductor chip, arranged on the carrier, for emitting a primary radiation;
    an at least partly transparent medium at least partly enclosing the semiconductor chip and having a height above the carrier and a width along the carrier;
    particles introduced in the medium and serving for interaction with the primary radiation, wherein the medium has a ratio of the height to the width of greater than 1; and
    a partly reflective layer which is provided at least in regions on a side of the medium which faces away from the semiconductor chip,
    wherein the partly reflective layer comprises titanium dioxide reflective particles, and
    wherein the partly reflective layer suppresses frontal emission from the side of the medium which faces away from the semiconductor chip in favor of lateral emission from the medium, and a defined portion of the secondary radiation reflected back into the medium by the partly reflective layer is set by way of the content of titanium dioxide reflection particles in the layer.

18. The optoelectronic component as claimed in claim 17, wherein the partly reflective layer reflects secondary radiation from an entire visible spectral range.

* * * * *